US008337713B2

(12) United States Patent
Loewenhardt et al.

(10) Patent No.: US 8,337,713 B2
(45) Date of Patent: Dec. 25, 2012

(54) METHODS FOR RF PULSING OF A NARROW GAP CAPACITIVELY COUPLED REACTOR

(75) Inventors: Peter Loewenhardt, Pleasanton, CA (US); Mukund Srinivasan, Fremont, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/177,627

(22) Filed: Jul. 7, 2011

(65) Prior Publication Data

US 2011/0263130 A1    Oct. 27, 2011

Related U.S. Application Data

(62) Division of application No. 10/431,030, filed on May 6, 2003, now Pat. No. 7,976,673.

(51) Int. Cl.
*H01L 21/00* (2006.01)
*C23F 1/00* (2006.01)
(52) U.S. Cl. ..................... 216/67; 156/345.47
(58) Field of Classification Search .................. 438/710; 216/67
See application file for complete search history.

(56) References Cited

U.S. PATENT DOCUMENTS

| 5,534,751 | A | * | 7/1996 | Lenz et al. ............... 315/111.71 |
| 6,030,667 | A | * | 2/2000 | Nakagawa et al. ........... 427/569 |
| 6,070,552 | A | * | 6/2000 | Mizuno et al. ............. 118/723 E |
| 6,148,765 | A | * | 11/2000 | Lilleland et al. .......... 118/723 E |
| 6,214,162 | B1 | * | 4/2001 | Koshimizu ................ 156/345.28 |
| 6,426,477 | B1 | | 7/2002 | Koshimizu et al. |
| 6,902,683 | B1 | * | 6/2005 | Kaji et al. ........................ 216/71 |
| 2002/0042204 | A1 | | 4/2002 | Hayashi et al. |
| 2002/0059981 | A1 | | 5/2002 | Hao et al. |
| 2002/0096257 | A1 | | 7/2002 | Wang et al. |

FOREIGN PATENT DOCUMENTS

| JP | 08020880 A | * | 1/1996 |
| JP | 9-330913 | | 12/1997 |
| JP | 10-340887 | | 12/1998 |
| JP | 11-219938 | | 8/1999 |
| JP | 2000-31128 | | 1/2000 |
| JP | 2001110798 A | * | 4/2001 |

OTHER PUBLICATIONS

"Office Action", Taiwan Patent Application No. 093112507, Mailing Date: Jul. 5, 2011.
"Examination Report", Taiwan Patent Application No. 093112507, Mailing Date: May 10, 2012.

* cited by examiner

*Primary Examiner* — Rakesh Dhingra
*Assistant Examiner* — Anna Crowell
(74) *Attorney, Agent, or Firm* — IPSG, P.C. Intellectual Property Law

(57) ABSTRACT

A method for etching a layer over a substrate in a process chamber, wherein the process chamber including a first electrode and a second electrode and the first electrode is disposed opposite of the second electrode is provided. The method includes placing the substrate on the second electrode and providing an etching gas into the process chamber. The method also includes providing a first radio frequency (RF) signal into the process chamber and modulating the first RF signal. The method further includes providing a second RF signal into the process chamber and modulating the second RF signal.

6 Claims, 3 Drawing Sheets

METHODS FOR RF PULSING OF A NARROW GAP CAPACITIVELY COUPLED REACTOR

PRIORITY CLAIM

This application is a divisional of and claims priority under 35 U.S.C. §120 to a commonly assigned application entitled "RF Pulsing of a Narrow Gap Capacitively Coupled Reactor," by Loewenhardt et al., application Ser. No. 10/431,030, filed on May 6, 2003, which is now U.S. Pat. No. 7,976,673 B2, issued on Jul., 12, 2011, all of which are incorporated by reference herein.

BACKGROUND OF THE INVENTION

1. Field of the Invention

The invention relates to a method and apparatus for providing a structure on a semiconductor wafer by etching a layer over a substrate.

2. Description of the Related Art

In semiconductor plasma etching applications, a plasma etcher is usually used to transfer a mask pattern into a circuit and line pattern of a desired thin film and/or filmstack (conductors or dielectric insulators) on a wafer. This is achieved by etching away the films (and filmstacks) underneath the mask materials in the opened areas of the mask pattern. This etching reaction may be initiated by the chemically active species and electrically charged particles (ions) generated by generating a plasma from a reactant mixture contained in a vacuum enclosure also referred to as a reactor or process chamber. Additionally, the ions may be also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials may be removed by stripping them away, leaving in its place a replica of the lateral pattern of the original intended mask patterns.

It is known to use in inductively coupled plasma device an RF power source that is pulsed or modulated. It is believed that such pulsing allows electron temperature to drop rapidly during the off portion of the pulse, which lowers the average electron temperature. During the RF off period, when the electron temperature drops rapidly, the plasma ion density decreases at a much slower rate, since ions are more massive than electrons and therefore move much slower than electrons. Therefore, this process may significantly lower the average electron temperature, while keeping the average plasma density approximately unchanged. This may reduce electron shading effects, reducing electron damage to semiconductor device features. Such a process may pulse a single RF frequency.

SUMMARY OF THE INVENTION

To achieve the foregoing and in accordance with the purpose of the present invention, an apparatus for providing a plasma etch of a layer over a wafer is provided. A capacitively coupled process chamber is provided. A gas source is in fluid connection with the capacitively coupled process chamber. A first electrode is provided within the process chamber. A second electrode is spaced apart and opposite from the first electrode. A first radio frequency power source is electrically connected to at least one of the first and second electrodes, where the first radio frequency power source provides radio frequency power of between 150 kHz and 10 MHz. A second radio frequency power source is electrically connected to at least one of the first and the second electrodes, wherein the second radio frequency power source provides a radio frequency power of between 12 MHz and 200 MHz. A first modulation control is connected to the first radio frequency power source, to provide a controlled modulation of the first radio frequency power source at a frequency of between 1 kHz to 100 kHz.

In another embodiment of the invention, an apparatus for providing a plasma etch of a layer over a wafer is provided. A capacitively coupled process chamber is provided. A gas source is in fluid connection with the capacitively coupled process chamber. A first electrode is provided within the process chamber. A second electrode is spaced apart and opposite from the first electrode, where the second electrode is spaced apart from the first electrode forming a gap, and where the wafer is mountable between the first and second electrodes and wherein an aspect ratio of a wafer diameter to gap size is between 6:1 to 60:1. A first radio frequency power source for providing a power signal at a first frequency is electrically connected to at least one of the first and second electrodes. A second radio frequency power source for providing a power signal at a second frequency is electrically connected to at least one of the first and second electrodes, where the first frequency is different than the second frequency. A first modulation control is connected to the first radio frequency power source, to provide a controlled modulation of the first radio frequency power source at a frequency of between 1 kHz to 100 kHz. A second modulation control is connected to the second radio frequency power source, to provide a controlled modulation of the second radio frequency power source at a frequency of between about 1 kHz to about 100 kHz.

In another embodiment of the invention, a method for etching a layer over a wafer is provided. The wafer is placed in a capacitively coupled process chamber. An etching gas is provided into the process chamber. A capacitively coupled first radio frequency signal is provided into the process chamber. The first radio frequency signal is modulated. A capacitively coupled second radio frequency signal is provided into the process chamber. The second radio frequency signal is modulated.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompany drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During an etching process, etchant mixture gases dissociate into various species. For example, using an etch chemistry of $C_4F_8$ and $O_2$, the $C_4F_8$ may dissociate to ions of $CF_2^+$ and $F^+$ in an etch plasma. F+may tend to etch the photoresist. Therefore to increase etch selectively, it may be desirable to dissociate $C_4F_8$ to yield more $CF_2^+$ and less $F^+$. Therefore, it would be desirable to be able to control the ratio of resulting species generated in a plasma.

Figure 1:
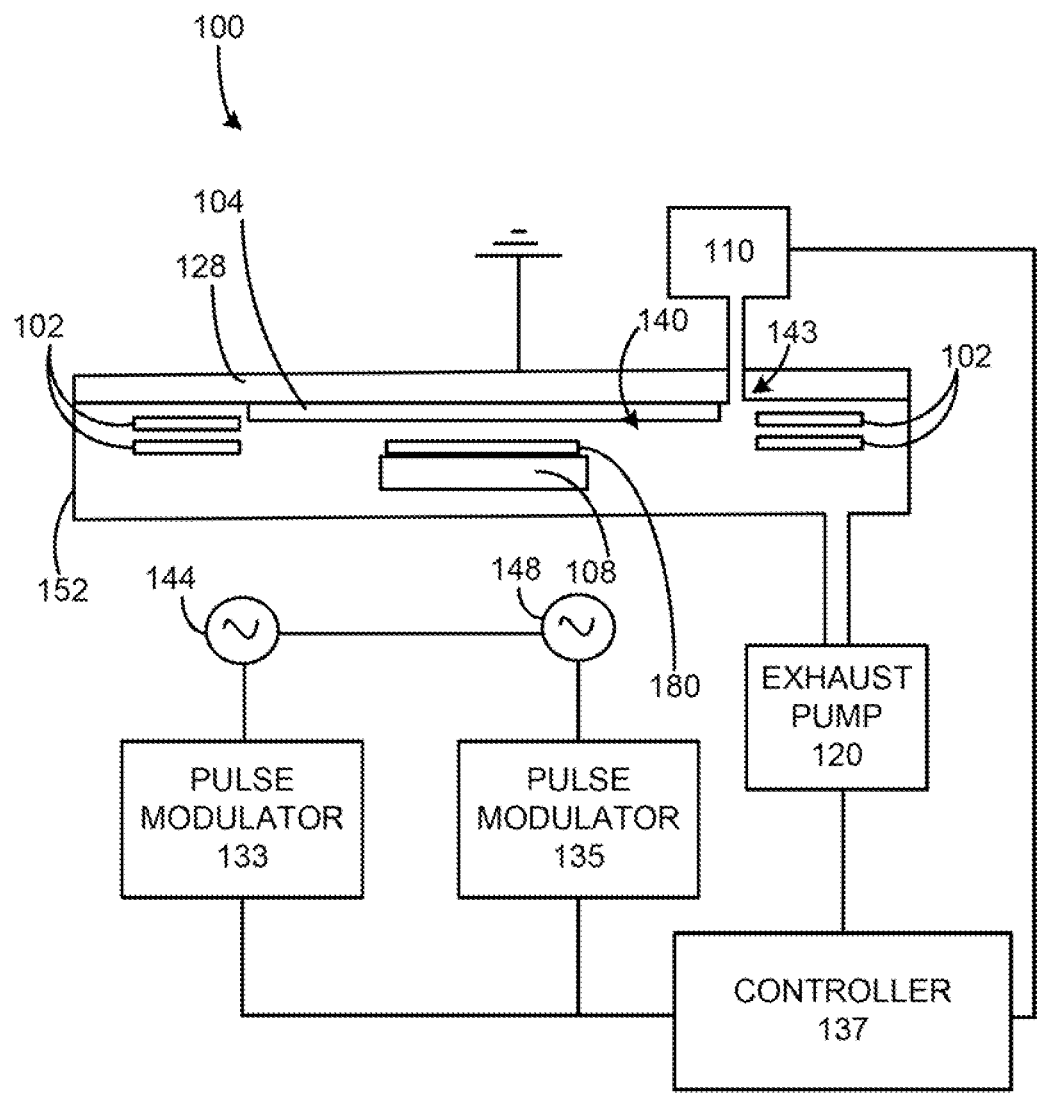
FIG. 1 is a schematic view of a capacitively coupled process chamber that may be used in the preferred embodiment of the invention.

FIG. 1 is a schematic view of a capacitively coupled process chamber 100 that may be used in the preferred embodiment of the invention. In this embodiment, the plasma processing chamber 100 comprises confinement rings 102, an upper electrode 104, a lower electrode 108, a gas source 110, and an exhaust pump 120. Within plasma processing chamber 100, the substrate wafer 180 is positioned upon the lower electrode 108. The lower electrode 108 incorporates a suitable substrate chucking mechanism (e.g., electrostatic, mechanical clamping, or the like) for holding the substrate wafer 180. A process chamber top 128 incorporates the upper electrode 104 disposed immediately opposite the lower electrode 108. The upper electrode 104, lower electrode 108, and confinement rings 102 define the confined plasma volume 140. Gas is supplied to the confined plasma volume by gas source 110 through a gas inlet 143 and is exhausted from the confined plasma volume through the confinement rings 102 and an exhaust port by the exhaust pump 120. The exhaust pump 120 forms a gas outlet for the plasma processing chamber.

A first RF source 144 and a second RF source 148 are electrically connected to the lower electrode 108. The first RF source 144 provides a radio frequency power with a frequency between 150 kHz to 10 MHz. Preferably, this frequency is about 2 MHz. The second RF source 148 provides a radio frequency power with a frequency between 12 MHz and 200 MHz. Preferably, this frequency is about 27 MHz. Preferably, the frequency from the second RF source 148 is at least ten times the frequency from the first RF source 144. A first pulse modulator 133 is controllable connected to the first RF source 144. The first pulse modulator 133 is able to modulate the first RF source signal at frequencies between 1 kHz to 100 kHz. A second pulse modulator 135 is controllably connected to the second RF source 148. The second pulse modulator 135 is able to modulate the second RF source signal at frequencies between 1 kHz to 100 kHz. In this embodiment, the upper electrode 104 is grounded. A controller 137 may be controllably connected to the first pulse modulator 133, the second pulse modulator 135, the exhaust pump 120, and the gas source 110. The controller 137 may also be controllably connected with other devices, such as the first and second RF sources 144, 148. Chamber walls 152 define a plasma enclosure in which the confinement rings 102, the upper electrode 104, and the lower electrode 108 are disposed.

In a preferred embodiment, for processing a 300 mm wafer, the gap between the upper and lower electrodes 104, 108 is about 2 cm. Therefore, in this embodiment the aspect ratio between the diameter of the wafer 108 to be processed, which is about the diameter of the lower electrode 108, to the distance between the upper electrode and the lower electrode is 300 mm:2 cm, which is, 15:1. Preferably, the aspect ratio between the diameter of the wafer to be processed and the electrode gap is between 6:1 to 60:1. More preferably, the aspect ratio is between 10:1 to 40:1. As a result, this process chamber has an extremely narrow gap between electrodes. Such aspect ratios use gaps that allow a sheath to be a substantial fraction of the bulk plasma. Preferably, the gap between the upper electrode and lower electrode is less than 8 cm. More preferably, the gap between the upper electrode and the lower electrode is between about 0.5 and 4 cm. Most preferably, the gap between the upper electrode and lower electrode is about 2 cm.

Figure 2:
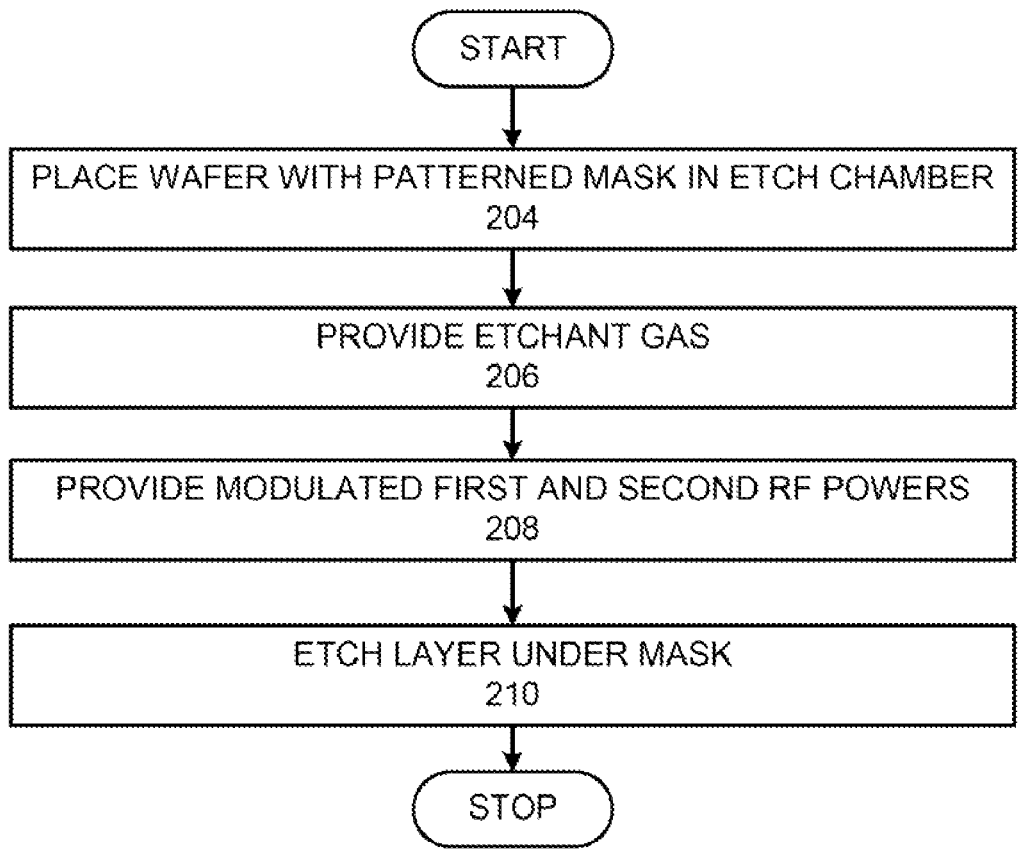
FIG. 2 is a flow chart of a process that may use a preferred embodiment of the invention.

FIG. 2 is a flow chart of a process that may use a preferred embodiment of the invention. In operation, a wafer 180 with a patterned mask is placed in the process chamber 100 (step 204). In this embodiment, the wafer 180 is supported by the lower electrode 108. An etchant gas mixture is provided by the gas source 110 into the plasma volume 140 (step 206). In this example, for etching a dielectric layer over the wafer and under a photoresist mask an etchant gas chemistry of Argon, $C_4F_8$, oxygen, and other component gases may be used. Modulated first and second RF powers are then provided (step 208) to create and sustain a plasma formed from the etchant gas. The plasma is used to etch the layer under the mask (step 210).

Without wishing to be bound by theory, it is believed that modulation of the RF power in a capacitively coupled process chamber causes a change in the sheath of the plasma. Such a change in some systems may only affect a small portion of the plasma volume. The inventive process chamber has a thin plasma volume, defined by a thin electrode gap and high aspect ratio, so that the sheath that is affected by the modulation forms a significant part of the plasma volume. As a result, the modulation may be used to independently control species dissociation and loss to generation ratios for a significant part of the plasma volume.

Figure 3:
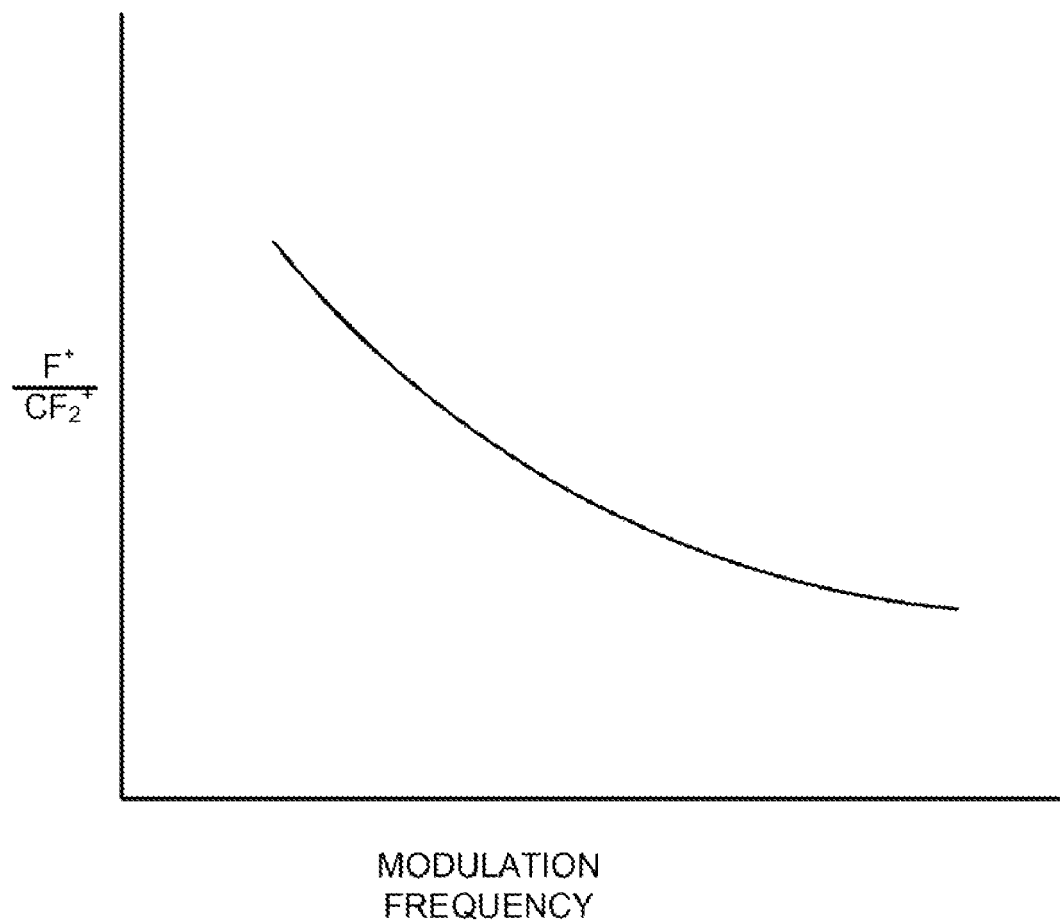
FIG. 3 is a graph of concentration ratios of $F^+$ over $CF_2^+$ versus modulation frequency.

FIG. 3 is a graph of concentration ratios of $F^+$ and $CF_2^+$ versus modulation frequency of the higher frequency RF source. The graph schematically shows that as the modulation frequency increases the ratio of $F^+$ to $CF_2^+$ decreases and that modulation frequency may be used to control the ratio. This is an example of how the invention may be used to control the dissociation ratios of gases in a significant portion of the plasma volume.

The plasma loss to generation ratio is dependent on various factors, such as the number of ions and electrons and their energies. Modulation may be used to change these various factors. As discussed above, such modulation may mainly affect the sheath region. Since the invention provides a sheath region that is a significant part of the volume, the modulation may be used to affect a significant volume of the plasma.

As the volume of the plasma bulk is changed a significant amount, the generation-loss balance in the plasma is altered. A change in balance is known to alter plasma parameters such as electron temperature (and thereby the plasma species fragmentation/dissociation).

The invention also provides an added control that may be used to tailor an etch according to the type of etch. For example, in etching a high aspect ratio contact, a lot of sheath is desired, to provide higher energy ions for etching. The pulse modulators would have a modulation frequency favoring a high sheath potential, even allowing for increased instantaneous lower frequency power during the pulse-on that would be achievable during continuous-wave operation. If instead a trench is to be etched in a low-k dielectric, ion bombardment should be reduced and therefore the sheath should be reduced. This may be accomplished by modulating the lower frequency that typically controls the wafer sheath, allowing further fine tuning of low ion energies.

Modulation may also used to change the percentage of the volume affected by the sheath. Therefore, the invention is able to provide an extra control, for controlling etch bias, sheath, and dissociation chemistry. The controller is able to cause the modulation of the RF power sources to be synchronized or to be modulated independently of each other.

In other embodiments, other RF power source and electrode arrangements may be used. For example, another embodiment may connect the first and second RF sources to the upper electrode.

Other etching benefits may be found from the inventive apparatus that has a narrow-plasma volume and allows the modulation of dual RF sources.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a layer over a substrate in a capacitively coupled process chamber, wherein said capacitively coupled process chamber includes a first electrode and a second electrode, wherein said first electrode is disposed opposite of said second electrode, said method comprising:
   placing said substrate on said second electrode;
   positioning said first electrode and said second electrode at a distance from one another such that a gap of between about 0.5 to 4.0 cm exists between said first electrode and said second electrode, wherein an aspect ratio between a diameter of said substrate and said gap is between 30:1 to less than 60:1;
   providing an etching gas into said capacitively coupled process chamber;
   providing a first radio frequency power source for providing a power signal at a first frequency having a frequency power between 150 kHz and 10 MHz; into said second electrode in said capacitively coupled process chamber;
   providing a second radio frequency power source for providing a power signal at a second frequency having a frequency power between 12 MHz and 200 MHz; into said second electrode in said capacitively coupled process chamber;
   providing a first modulation control connected to said first radio frequency power source, to provide a controlled modulation of said first radio frequency power source at a frequency of between 1 kHz to 100 kHz; and
   providing a second modulation control connected to said second radio frequency power source, to provide a controlled modulation of said second radio frequency power source at a frequency of between about 1 kHz to about 100 kHz.

2. The method of claim 1 wherein said gap is 2 cm.

3. The method of claim 1 wherein said etching gas includes at least one of $C_4F_8$, argon, and oxygen.

4. A method for etching a layer over a substrate in a process chamber, said process chamber including a first electrode and a second electrode, wherein said first electrode is disposed opposite of said second electrode such that a gap exists between said first electrode and said second electrode during said etching, said method comprising:
   placing said substrate on said second electrode;
   providing an etching gas into said process chamber;
   positioning said first electrode and said second electrode at a distance from one another such that said gap is between about 0.5 to 4.0 cm and exists between said first electrode and said second electrode, wherein an aspect ratio between a diameter of said substrate and said gap is between 30:1 to less than 60:1,
   providing a first radio frequency (RF) signal by a first RF power source having a frequency power between 150 kHz and 10 MHz; into said second electrode in said process chamber;
   modulating said first radio frequency RF signal at a frequency power between 1 kHz and 100 kHz by a first pulse modulator connected to a controller;
   providing a second radio frequency RF signal by a second RF power source having a frequency power between 12 MHz and 200 MHz; into said second electrode in said process chamber; and
   modulating said second radio frequency RF signal at a frequency power between 1 kHz and 100 kHz by a second pulse modulator connected to a controller.

5. The method of claim 4 wherein an aspect ratio between as diameter of said substrate and said gap is between 30:1 to 40:1.

6. The method of claim 4 wherein said process chamber is a capacitively coupled process chamber.

* * * * *